US012747495B2

(12) United States Patent
Gicquel et al.

(10) Patent No.: US 12,747,495 B2
(45) Date of Patent: Sep. 29, 2026

(54) METHOD FOR FUNCTIONALIZING A POLYMER-BASED SUBSTRATE BY CHEMICAL DEPOSITION OF A THIN LAYER

(71) Applicants: INSTITUT POLYTECHNIQUE DE GRENOBLE, Grenoble (FR); CENTRE NATIONAL DE LA RECHERCHE SCIENTIFIQUE, Paris (FR); UNIVERSITE GRENOBLE ALPES, Saint Martin D'Heres (FR)

(72) Inventors: Erwan Gicquel, Gieres (FR); Frederic Mercier, Gieres (FR); Raphael Boichot, Domene (FR); Elisabeth Blanquet, Claix (FR); Evelyne Mauret, Grenoble (FR); Roman Reboud, Saint Pierre de Chartreuse (FR); Julien Bras, Saint Martin D'Uriage (FR)

(73) Assignees: INSTITUT POLYTECHNIQUE DE GRENOBLE, Grenoble (FR); CENTRE NATIONAL DE LA RECHERCHE SCIENTIFIQUE, Paris (FR); UNIVERSITE GRENOBLE ALPES, Saint Martin d'Heres (FR)

( * ) Notice: Subject to any disclaimer, the term of this patent is extended or adjusted under 35 U.S.C. 154(b) by 101 days.

(21) Appl. No.: 18/006,335

(22) PCT Filed: Jul. 20, 2021

(86) PCT No.: PCT/EP2021/070300

§ 371 (c)(1),
(2) Date: Jan. 20, 2023

(87) PCT Pub. No.: WO2022/018100

PCT Pub. Date: Jan. 27, 2022

(65) Prior Publication Data

US 2023/0272522 A1 Aug. 31, 2023

(30) Foreign Application Priority Data

Jul. 21, 2020 (FR) ...................................... 2007668

(51) Int. Cl.
*C23C 16/04* (2006.01)
*C23C 16/01* (2006.01)
(Continued)

(52) U.S. Cl.
CPC ............ *C23C 16/045* (2013.01); *C23C 16/01* (2013.01); *C23C 16/403* (2013.01); *C23C 16/45555* (2013.01)

(58) Field of Classification Search
CPC .............................. C23C 16/045; C23C 16/01
See application file for complete search history.

(56) References Cited

U.S. PATENT DOCUMENTS 3,087,233 A * 4/1963 Turnbull .............. B22F 3/1121 428/605
6,186,090 B1 2/2001 Dotter, II et al.
(Continued)

FOREIGN PATENT DOCUMENTS

WO 2010037906 A1 4/2010
WO 2010065966 A2 6/2010
(Continued)

OTHER PUBLICATIONS

Korhonen et al., "Hydrophobic Nanocellulose Aerogels as Floating, Sustainable, Reusable, and Recyclable Oil Absorbents," ACS Applied Materials & Interfaces, 2011, 3, 1813-1816.
(Continued)

*Primary Examiner* — Alex A Rolland
(74) *Attorney, Agent, or Firm* — HAUPTMAN HAM, LLP

(57) ABSTRACT

A method for functionalizing a cellulose-based substrate by chemical deposition of at least one thin layer, from gaseous
(Continued)

precursors. The method includes the provision of a substrate including at least one sheet having a first face and a second face, of surface roughness greater than or equal to 0.1 μm. The first face has a part superposed to another part belonging to the first face or to the second face. A spacing between said parts is conserved at least locally, so as to enable a diffusion of the gaseous precursors. The method also includes the gaseous chemical deposition of at least one thin layer on the substrate such as provided by diffusion of the gaseous precursors, the gaseous precursors diffusing at least in each spacing.

17 Claims, 7 Drawing Sheets

(51) Int. Cl.

*C23C 16/40* (2006.01)

*C23C 16/455* (2006.01)

(56) References Cited

U.S. PATENT DOCUMENTS

| | | | | |
|---|---|---|---|---|
| 2005/0170668 | A1 | 8/2005 | Park et al. | |
| 2005/0186338 | A1 | 8/2005 | Roscheisen et al. | |
| 2007/0259111 | A1* | 11/2007 | Singh | C23C 16/45508 427/248.1 |
| 2011/0048327 | A1 | 3/2011 | Carcia et al. | |
| 2011/0223401 | A1* | 9/2011 | Harlin | C23C 16/45555 427/250 |
| 2012/0031336 | A1 | 2/2012 | Hsu | |
| 2012/0171376 | A1* | 7/2012 | Dodge | D06M 11/36 427/255.394 |
| 2014/0272432 | A1* | 9/2014 | Dodge | C23C 16/45555 427/256 |
| 2016/0152518 | A1 | 6/2016 | Ouderkirk et al. | |
| 2017/0166456 | A1 | 6/2017 | Darling et al. | |
| 2017/0170009 | A1 | 6/2017 | Tanaka et al. | |
| 2017/0203258 | A1 | 7/2017 | Darling et al. | |
| 2018/0010248 | A1 | 1/2018 | Darling et al. | |
| 2018/0179629 | A1 | 6/2018 | Mancevski | |
| 2018/0274101 | A1 | 9/2018 | Kano | |

FOREIGN PATENT DOCUMENTS

| | | | |
|---|---|---|---|
| WO | 2011078770 | A1 | 6/2011 |
| WO | 2015034208 | A1 | 3/2015 |
| WO | 2016081213 | A1 | 5/2016 |
| WO | 2017070634 | A1 | 4/2017 |
| WO | 2017099057 | A1 | 6/2017 |
| WO | 2017172531 | A1 | 10/2017 |
| WO | 2018013367 | A1 | 1/2018 |

OTHER PUBLICATIONS

Korhonen et al., "Inorganic Hollow Nanotube Aerogels by Atomic Layer Deposition onto Native Nanocellulose Templates," ACS Nano, 2011, vol. 5, No. 3, 1967-1974.

Munoz-Rojas et al., "Spatial Atomic Layer Deposition," Chemical Vapor Deposition for Nanotechnology, Provisional chapter, 1-25.

Omerzu et al., "Prevention of spontaneous combustion of cellulose with a thin protective Al2O3 coating formed by atomic layer deposition," Surface & Coatings Technology, 333 (2018) 81-86.

Putkonen et al., "Low-temperature atomic layer deposition of SiO2/Al2O3 multilayer structures constructed on self-standing films of cellulose nanofibrils," The Royal Society Publishing, 1-12.

Yang et al., "Nature Degradable, Flexible, and Transparent Conductive Substrates from Green and Earth-Abundant Materials," Scientific Reports, 7:4936, 1-8.

Jur et al., "Atomic Layer Deposition of Conductive Coatings on Cotton, Paper, and Synthetic Fibers: Conductivity Analysis and Functional Chemical Sensing Using "All-Fiber" Capacitors," Advanced Functional Materials, vol. 21, No. 11, 2011, 1993-2002.

Hirvikorpi et al., "Thin Al2O3 barrier coatings onto temperature-sensitive packaging materials by atomic layer deposition," Surface & Coatings Technology, vol. 205, No. 21, 2011, 5088-5092.

International Search Report and Written Opinion issued in corresponding International Application No. PCT/EP2021/070300, mailed Nov. 15, 2021, pp. 1-10, European Patent Office, Rijswijk, Netherlands.

* cited by examiner

METHOD FOR FUNCTIONALIZING A POLYMER-BASED SUBSTRATE BY CHEMICAL DEPOSITION OF A THIN LAYER

The present application is a U.S. National Phase of International Application Number PCT/EP2021/070300, filed Jul. 20, 2021, which claims priority to French Application No. 2007668, filed Jul. 21, 2020.

TECHNICAL FIELD OF THE INVENTION

The present invention relates to the field of methods for functionalising a polymer-based substrate by chemical deposition of a thin layer, from gaseous precursors. The present invention relates more specifically to the functionalisation of a bio-sourced substrate by chemical deposition of a thin layer, from gaseous precursors. It has a particularly advantageous application in the field of thermally insulating materials and food packaging.

STATE OF THE ART

In numerous fields of applications, it is constantly sought to improve the properties of the materials used and to minimise their manufacturing cost. For example, in the field of thermal insulation, it is sought to obtain efficient thermal insulators which further have good mechanical properties in their environment of use. According to another example, in the field of packaging, it is sought to obtain materials having good oxygen and water barrier properties, and mechanical properties which are compatible with their shaping.

In these fields of application, it is moreover sought to increase the bio-sourced part of the materials used, in order to limit their environmental impact. Bio-sourced polymer-based substrates are, for that, promising candidates. However, these polymers are generally considered as less efficient than the original petrochemical substrates, particularly concerning their mechanical properties, as well as their oxygen and water barriers. Furthermore, these substrates often have a complex geometry, for example they are porous and/or have a high surface roughness.

Generally, in order to modify and/or complete the properties of a substrate, there are, on the industrial scale, several solutions aiming to deposit a thin layer on the substrate.

Methods implementing a physical vapour deposition are known. Physical vapour deposition however remains limited as regards the nature of the substrate. In particular, it is this technique of obtaining a continuous thin layer of homogenous thickness on a substrate with complex geometry.

Moreover, there are methods implementing a chemical deposition from gaseous precursors and having deposition speeds which are compatible with a substrate functionalisation on the industrial scale. Among these chemical depositions, spatial atomic layer depositions (SALDs) are known. In atomic layer depositions, conventionally a sequence of several cycles is used, comprising an exposure of the substrate to precursors, followed by their draining. In SALDs, this sequence is replaced by an alternative approach, wherein the different precursors are provided continuously and spatially separated from one another by inert gas barriers. The substrate to be functionalised is thus moved between the different precursor zones.

SALDs can be implemented to functionalise a substrate being presented before and after the deposition in the form of a stack comprising a plurality of sheets, for example, in the form of a coil. More specifically, the coil is unwound to be moved between the different precursor injection zones during the functionalisation, then the functionalised substrate can be wound again to reform the coil.

For example, there are close proximity SALD methods, wherein a coil of a substrate is unwound and is moved along the circumference of a drum. Along this circumference, different precursors are provided and are spatially separated from one another by inert gas barriers.

According to another example, there are so-called "roll-to-roll" SALD methods, wherein a coil of a substrate is unwound and is moved between different rolls in a deposition chamber. The different precursors are provided in different zones of the deposition chamber.

These methods however remain complex to implement. In particular, they require expensive and complex equipment, limiting their robustness in use. Furthermore, in order to obtain a deposition speed enabling a profitable manufacturing rate, the movement of the substrate in these methods must be rapid. This limits the continuous thin layer deposition and of homogenous thickness on a substrate with complex geometry.

Document US 2012/0171376 A1 discloses a deposition method which is compatible on a non-ceramic porous substrate by ALD, wherein three portions of the porous substrate can be kept spaced apart by spacers.

Document US 2011/0048327 A1 discloses a method for functionalising a PET film disposed in rolls on a cassette configured to keep a space between the roll rotations.

Documents US 2016/0152518 A1 and US 2005/0186338 A1 disclose a method for functionalising a rolled polymer film. The film is wound around a central body or on itself and is spaced between its rotations by a spacer.

In practice, these methods remain complex to implement and are not very suitable for a functionalisation on the industrial scale of a polymer substrate.

An aim of the present invention is therefore to propose an improved chemical vapour deposition method which is compatible with a functionalisation of a substrate on the industrial scale. A non-limiting aim of the invention can further be to propose an improved chemical vapour deposition method which is compatible with the functionalisation of a bio-sourced substrate, and in particular cellulose-based, on the industrial scale.

Other aims, features and advantages of the present invention will appear upon examining the following description and the accompanying drawings. It is understood that other advantages can be incorporated.

SUMMARY OF THE INVENTION

To achieve this aim, according to an aspect of the invention, a method for functionalising a cellulose-based substrate by chemical deposition of at least one thin layer, from gaseous precursors, comprising:

- a provision of a cellulose-based substrate
  - comprising at least one sheet having a first face and a second face opposite the first face, at least one face having a surface roughness greater than or equal to 0.1 μm,
  - the first face having a part superposed to another part belonging to the first face or to the second face of the at least one sheet, said parts being superposed,
  - so as to conserve at least locally, a spacing between said parts, configured to enable a diffusion of the gaseous precursors, then a gaseous chemical deposition of at least one thin layer on the substrate such as provided by diffusion of the gaseous precursors, the gaseous precursors diffusing at least in each spacing.

According to another aspect, a method for functionalising a polymer-based substrate by chemical deposition of at least one thin layer from gaseous precursors is provided, comprising:

the provision of a substrate comprising a plurality of sheets at least partially superposed two-by-two to form a stack, each sheet having a first face and a second face opposite the first face, each part of the face of a sheet, superposed to a part of the face of another sheet in the stack, having at least locally a spacing at the part of the face of the other sheet, the spacing being configured to enable a diffusion of the gaseous precursors, then a gaseous chemical deposition of at least one thin layer on the substrate such as provided by diffusion of the gaseous precursors, the gaseous precursors diffusing at least in each spacing.

For the methods according to either of the aspects above, the stack thus has a spacing between the sheets, such that the at least one thin layer is deposited on each face of each sheet in the stack. The substrate is thus functionalised. The method enables the deposition of at least one thin layer on each sheet of the stack without requiring a deployment or an unwinding of the substrate. The faces of the sheets of the stack are functionalised in parallel. The method makes it possible to functionalise an extended surface in a simplified manner, thus enabling applications on the industrial scale.

The equipment associated with the method is also simplified, since it is not necessary to resort to numerous movable parts intended for the deployment or for the unwinding of the substrate. The robustness and therefore the service life of the associated equipment are consequently improved.

The method and the associated equipment being simplified, the cost of the functionalised substrate obtained can further be decreased with respect to the current solutions.

Thanks to the diffusion of the gaseous precursors in the stack, the method further enables to functionalise a substrate having a complex geometry, for example a porous substrate and/or having a high surface roughness.

This is particularly advantageous for cellulose-based substrates, the face(s) of which have a roughness greater than or equal to 0.1 μm. It is thus possible to functionalise a bio-sourced polymer-based substrate having a complex geometry, for example a porous substrate and/or having a high surface roughness. The chemical deposition being done from gaseous precursors, the method further avoids an immersion of the substrate in a liquid phase which could damage certain substrates, and in particular bio-sourced substrates. With the substrate being cellulose-based, the method makes it possible to obtain a functionalised substrate from a biodegradable, renewable and recyclable material. With cellulose-based substrates generally having the property of absorbing liquids, for example, water, and of deteriorating in a wet medium, the method makes it possible to deposit a protective layer of the substrate.

Surprisingly, it has been highlighted during the development of the invention that a roughness greater than or equal to 0.1 μm enables to create at least locally the spacing to enable the diffusion of the gaseous precursors. It is subsequently not necessary to use an intercalation compound configured to conserve the spacing. The functionalisation of the substrate is therefore simplified. Furthermore, even in the presence of an intercalation compound, this roughness facilitates the diffusion of the precursors in the contact zone between the intercalation compound and the substrate.

According to an example, said superposed parts face one another, preferably directly facing one another.

According to an example, there is no sheet between the first and second parts which face one another or are superposed.

The substrate can be disposed in a deposition chamber and be immovable at least in translation with respect to the deposition chamber during the chemical deposition of the thin layer. Thus, the equipment associated with the method is further simplified, since it is not necessary to resort to parts intended for the movement of the substrate.

Another aspect of the invention relates to a substrate obtained by the functionalisation method according to the first aspect of the invention.

BRIEF DESCRIPTION OF THE FIGURES

The aims, objective, as well as the features and advantages of the invention will emerge best from the detailed description of an embodiment of the latter, which is illustrated by the following accompanying drawings, wherein.

Figure 1:
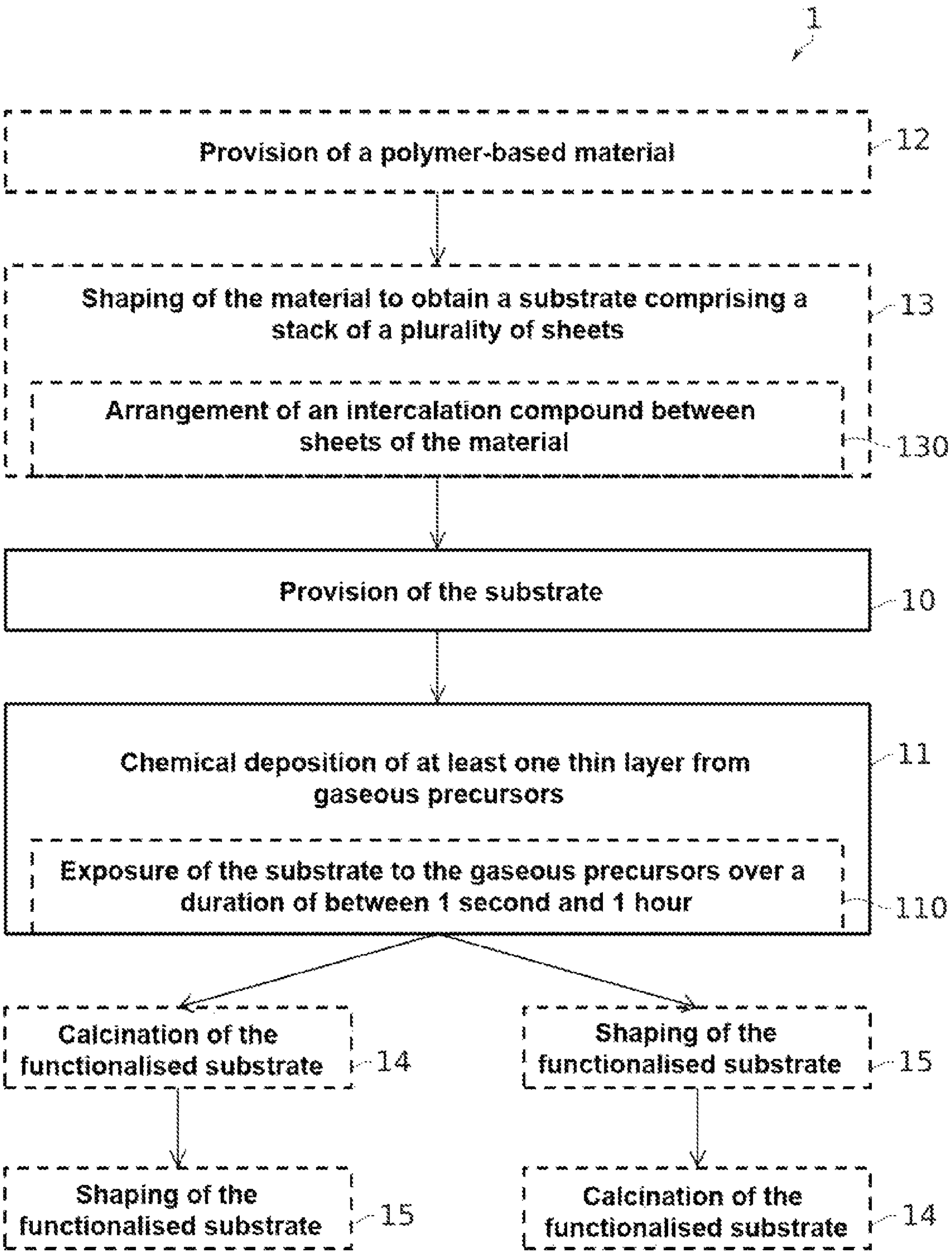
FIG. 1 illustrates, in a simplified manner, the steps of the method for functionalising the substrate according to different embodiments of the invention.

The drawings are given as examples and are not limiting of the invention. They constitute principle schematic representations intended to facilitate the understanding of the invention and are not necessarily to the scale of practical applications. In particular, the relative thicknesses of the deposited layer, of the spacing and of the substrate are not representative of reality and their possible variation between the figures is not representative of reality.

DETAILED DESCRIPTION OF THE INVENTION

Before starting a detailed review of embodiments of the invention, optional features are stated below, which can optionally be used in association or alternatively:

the substrate can be disposed in a deposition chamber and be immovable at least in translation with respect to the deposition chamber during the chemical deposition of the thin layer. The substrate can be immovable in translation and in rotation with respect to the deposition chamber during the chemical deposition of the thin layer;

the substrate can be placed on a wall of the deposition chamber, without any additional member for maintaining the substrate, and more specifically, without any maintaining member configured to conserve the spacing between the parts of the at least one sheet;

during the chemical deposition of the at least one thin layer, the substrate can have no intercalation compound, or equivalently, any element forming a spacer between the parts of the at least one sheet. Thus, the method is easier to implement. Furthermore, the functionalisation of the substrate is improved by limiting the risk that a zone covered by the intercalation compound is not functionalised. The compactness of the stack is increased, thus increasing the functionalisation efficiency of the substrate;

the chemical deposition of the at least one thin layer is performed directly on the substrate. The chemical deposition of the at least one thin layer can be performed without deposition of an adhesion layer prior to the deposition of the at least one thin layer;

the at least one thin layer having a thickness $e_3$, each spacing is greater than $2e_3+L_d$, with $L_d$ a distance greater than 50 nm. Thus, this spacing enables the diffusion of the precursors in the stack by limiting the risk of filling each spacing between the sheets of the stack;

each spacing is less than 5 mm, even less than 1 mm, even less than 0.5 mm, even less than 20 μm;

each spacing can only be defined by the shape of the at least one sheet, for example in the form of a coil, stack or folding, for example concertinaed, and/or the surface roughness of the substrate;

the substrate can have a length and/or a width, in the main extension plane of the sheets of the stack, of between a few centimetres and a few metres, for example between 1 cm and 3 m. These dimensions typically correspond to paper and/or tissue substrates manufactured on the industrial scale, for example in the form of a coil;

the deposition of the at least one thin layer is performed by atomic layer deposition. The atomic layer deposition facilitates the deposition of a thin layer by minimising further the risk of filling between the sheets of the stack;

the deposition temperature of the at least one thin layer is less than 200° C.;

according to an example, the deposition temperature of the at least one thin layer is between the ambient temperature and 200° C., for example between 20° C. and 200° C., even between 60° C. and 150° C.;

the at least one deposited thin layer, even the assembly formed by the deposited thin layers, has a thickness $e_3$ less than 100 nm, over at least 80%, even at least 90%, even at least 99%, of the at least one deposited thin layer, and preferably a thickness of between 1 angstrom and 100 nm, even between 10 nm and 60 nm, even between 10 and 40 nm. The deposition of the at least one thin layer can be configured such that the at least one deposited thin layer has a thickness less than 100 nm, and preferably a thickness of between 1 angstrom and 100 nm, even between 10 nm and 60 nm, even between 10 and 40 nm, over at least 80%, even at least 90%, even at least 99%, of the at least one deposited thin layer;

the deposition of the at least one thin layer comprises at least one injection of gaseous precursors, so as to expose the substrate to the gaseous precursors for a duration of between 1 second and 1 hour, even between 1 second and 10 minutes, preferably between 1 second and 30 seconds;

during the chemical deposition of the at least one thin layer, the pressure of a reactive atmosphere comprising the gaseous precursors is between 0.1 mbar and 1000 mbar;

the sheets of the stack are integral between one another, for example they form a continuous substrate, or equivalently, a monolithic substrate, for example folded or wound on itself. The substrate can be in the form of a coil or a folding. According to a more particular example, the stack is a coil or a superposition of sheets obtained by folding a monolithic sheet;

said parts belong to one same face of the sheet, the sheet being folded such that the parts face one another, two-by-two;

said parts belong to two opposite faces of the sheet, the sheet being wound such that the parts face one another, two-by-two;

the sheets of the stack are distinct or non-integral, for example they form a discontinuous substrate. According to an example, the sheets are at least partially superposed. According to a more particular example, the stack is a superposition of non-integral sheets, such as a ream of paper;

said parts belong to distinct sheets, for example stacked or superposed, such that the parts face one another, two-by-two;

the substrate has, on at least one of its faces, and preferably on each face, a surface roughness substantially greater than 0.1 μm;

the substrate has, on at least one of its faces, and preferably on each face, a surface roughness of between 0.1 μm and 200 μm, preferably 100 μm, more preferably 20 μm;

the substrate has, on at least one of its faces, and preferably on each face, a surface roughness substantially less than 200 μm, preferably 100 μm, more preferably 20 μm;

the substrate has an open porosity. When the substrate has an open porosity, the gaseous precursors diffuse in each spacing between the sheets and through the sheets in the stack direction of the sheets. At a given time, the surface of the substrate in contact with the gaseous precursors is therefore maximised with respect to the current solutions. Thus, the method makes it possible to obtain a porous substrate functionalised by a thin layer in a reduced time with respect to the current solutions. Furthermore, the thin layer is thus deposited on the internal cavities of each sheet. According to an example, the substrate having an open porosity is chosen from among a foam, a xerogel, an aerogel, a cryogel and a paper;

the substrate can be configured, such that the gaseous precursors do not pass through the faces of the at least one sheet. The substrate can be non-porous or be closed;

each sheet of the stack has a thickness $e_{200}$ less than 5 mm, preferably less than 1 mm, preferably less than 0.5 mm;

the substrate comprises sheets chosen from among at least one from among paper and tissue, which could, in particular have a thickness $e_{200}$ less than 5 mm, preferably 1 mm, preferably less than 0.5 mm. According to an example, each sheet is a paper or a tissue;

- each sheet of the stack has a thickness $e_{200}$ greater than 1 mm, each sheet being preferably a foam, a xerogel, a cryogel or an aerogel;
- the substrate is bio-sourced polymer-based, and preferably the substrate is cellulose-based and/or starch-based. More specifically, the substrate can be based on one from among cellulose fibres and cellulose nanofibres;
- the method further comprises, before the provision of the substrate, a shaping of a polymer-based material, from which the substrate is formed, even constituted, so as to form the stack;
- the shaping of the material can comprise the arrangement of an intercalation compound between sheets of the material, preferably between each pair of sheets superposed two-by-two in the stack. The intercalation compound makes it possible to module the spacing between the sheets. According to an example, the intercalation compound is porous. Thus, the gaseous precursors can diffuse through the intercalation compound;
- the at least one deposited thin layer is a layer based on a material chosen from among an oxide, a nitride and an oxynitride;
- the method can further comprise, after the chemical deposition of the at least one thin layer, a calcination of the substrate. During this calcination, the substrate can be heated to a temperature of between the degradation temperature of the substrate and the degradation temperature of the at least one thin layer.

It is specified that, in the scope of the present invention, the terms “superposed”, “on”, “surmounts”, “covers”, “underlying”, “opposite” and their equivalents do not necessarily mean “in contact with”. Thus, for example, the deposition of a first layer on a second layer, unless otherwise mentioned, does not compulsorily mean that the two layers are directly in contact with one another, but means that the first layer covers at least partially the second layer by being either directly in contact with it, or by being separated from it by at least one other layer or at least one other element.

A layer can moreover be composed of several sublayers made of one same material or of different materials.

It is specified that, in the scope of the present invention, the thickness of a layer or of the substrate, and the spacing between the sheets of the substrate, is measured in a direction perpendicular to the surface according to which this layer, this substrate or these sheets has/have its/their maximum extension. In FIGS. 2A, 2B, 3A, 3B, 4A, 4B, 6A and 6B, the thickness is measured along the axis z. In FIGS. 2C and 2D, 3C, 3D and 4C, the thickness is measured in a direction perpendicular to the axis z.

By compound or material “based on” a material A, this means a compound or material comprising this material A, and optionally other materials.

The word “bio-sourced” means materials of natural origin, for example coming from renewable resources, and more specifically materials coming from biomass of animal, algal or plant origin.

The term “paper” generally means the material manufactured with plant fibres or their derivatives, such as cellulose fibres, microfibres or nanofibres. To obtain paper, these fibres are typically extracted from wood by different methods, for example chemical, mechanical, thermomechanical or chemi-thermomechanical methods, which leads to the obtaining of fibre pastes or pulps. They are typically then suspended in water and can undergo a certain number of steps, such as purification, refining, dilution, transport, storage, having to be drained, for example on a forming fabric. The wet fibrous mat is typically then pressed and dried to obtain the sheet of paper. These sheets can be layered, impregnated or transformed during or after their manufacture. The term “paper” can, in particular, apply to sheets, the grammage of which is less than 250 g/m$^2$.

It is known to form cellulose nanofibres, also called nanocellulose, from cellulose fibres, and in particular from cellulose fibres coming from resinous or deciduous wood pastes. Nanocellulose is a heterogenous nanomaterial composed of elements of a micrometric size, cellulose fibre fragments, and at least 50% by number of nanoobjects (i.e. objects, of which at least one of the dimensions is between 1 and 100 nanometres—nm). These cellulosic nanoobjects are more specifically microfibres or microfibrils, CMF (cellulose microfibrils), or also nanofibres or nanofibrils, CNF (cellulose nanofibrils). Cellulose micro- or nanofibrils typically have a diameter of between 5 and 100 nm and a length of between 0.2 and 5 μm. It is noted that, in the scope of the present invention, the terms “nanofibrillated cellulose” or “cellulose nanofibres” are used equally to mean nanofibrillated cellulose, or cellulose nanofibres (CNF), and microfibrillated cellulose, or cellulose microfibres (CMF).

The term “tissue” means a substrate formed by the interweaving of fibres or of textile threads. Typically, a “woven” tissue has at least a warp thread assembly extending in a first direction, and a weft thread assembly extending in a second direction, distinct from the first. The term “non-woven” means a tissue formed of a textile fibre assembly disposed at random. The fibres can typically have undergone a fusion, in particular in the case of thermoplastic fibres, or a bonding by means of a binder such as starch, glue, casein, rubber, latex, a cellulosic derivative or a synthetic resin.

By a parameter “substantially equal to/greater than/less than” a given value, this means that this parameter is equal to/greater than/less than a given value, plus or minus 10%, even plus or minus 5%, of this value.

By porosity of a substrate or of a layer, this means the volume not occupied by the material composing it, relative to the apparent volume of the substrate or of the layer. This proportion by volume can be occupied by vacuum, gas or a liquid, for example, water. This proportion is delimited by a plurality of cavities.

By “cavity”, this means a volume not occupied by the material and formed in the material. According to an example, the porosity of the material is homogenous, i.e. that the porosity per unit of volume is substantially identical in any portion of one same determined size of the material.

By “open” porosity, this means the porosity of a substrate or of a layer communicating with the environment of the substrate or of the layer. In an open porosity, the cavities can be of dimensions greater than 10 nm.

In the scope of the present invention, a so-called “open” material, for example, a tissue or paper, means a material having a porosity at least partially communicating with the environment of the substrate. Thus, a gas can pass through the open material. This gas can more specifically comprise the gaseous precursors of the deposition of the thin layer. The porosity of the material can, in particular, be greater than 5%, even 30%, even 40%, even 50% of the apparent volume of the material.

On the contrary, a so-called “closed” material, for example, a tissue or paper, means a material having a porosity not enabling a gas to pass through the material. This gas can more specifically comprise the gaseous precursors of the deposition of the thin layer. The closed material can have a low porosity, typically less than 5% of the apparent volume of the material. For example, a closed paper is an impregnated paper of a material filling at least partially, even totally, its porosity. According to an example a closed paper can be a refined paper, for example a tracing paper.

The method is now described in reference to FIG. 1, wherein optional steps of the method 2 are indicated as a dotted line, and variants of the method are indicated by branching arrows.

The method 1 comprises the provision 10 of a polymer-based substrate 2, preferably cellulose-based or made of cellulose. The substrate 2 can, in particular, be provided to the reactor 5 for depositing a thin layer, subsequently described in detail. The substrate 2 provided is a multi-sheet substrate 2. This substrate 2 comprises at least one sheet 200 having a first face 200*a* and a second face 200*b* opposite the first face 200*a*. The substrate is configured such that the sheet(s) has/have parts 200*c* superposed to one another. Thus, it is understood that the substrate comprises a stack 20 of a plurality of parts 200*c* of sheets 200. The parts 200*c* of the sheet(s) 200 are at least partially superposed two-by-two to form a stack 20. The parts 200*c* of the sheet(s) 200 superposed two-by-two are further separated by a spacing 201, at least locally non-zero, described in more detail below.

Then, the method 1 comprises a chemical deposition 11 of at least one thin layer 3 from gaseous precursors. A plurality of thin layers 3 made of one same material or of different materials can be deposited. Below, the non-limiting example is referred to, wherein a thin layer 3 made of a given material is deposited on the substrate 2. The deposition 11 is, for example performed by a chemical vapour deposition (CVD), or preferably by an atomic layer deposition (ALD). The deposition 11 of the thin layer 3 can be performed on an adhesion layer deposited beforehand on the substrate 2. For example, such an adhesion layer can be polymer-based. Preferably, the thin layer 3 is deposited 11 directly on the substrate 2, without an intermediate adhesion layer.

The deposition 11 is performed on the substrate 2 such as provided 10. More specifically, between the provision 10 of the substrate 2 and the deposition 11, even the end of the deposition 11, the arrangement of the substrate 2, and in particular the spacing 201 between the parts 200*c* of the sheet(s) 200 remains substantially constant. According to an example, the substrate 2 is disposed in a deposition chamber 50 of the reactor 5 and is immovable with respect to the deposition chamber 50 during the deposition 11 of the thin layer 3. According to an example, the substrate 2 rests on a wall of the deposition chamber 50 of the reactor 5 without any additional maintaining member. In particular, during the deposition of the layer 3, no element of the reactor 5 is configured to maintain the spacing 201. The method is thus simplified and its cost minimised, while enabling the diffusion of the gaseous precursors in the spacing.

The spacing 201 between two sheets 200 superposed directly to one another in the stack 20 is configured to enable the diffusion of the gaseous precursors in the stack 20. Thus, the surface of the sheets 200 of the substrate 2 is accessible to the precursors. Preferably, all of the surface of the sheets 200 is accessible to the precursors. The gaseous precursors can be diffused to be deposited on this accessible surface and form the thin layer 3 there. The surfaces of each sheet 200 of the stack 20 are therefore functionalised in parallel. The deposition 11 is preferably configured such that the precursors diffuse in the whole stack 20. The deposition can, in particular, be configured such that the thin layer 3 is deposited at least over 90%, even 95%, even 99% of the surface of the sheets 200 of the stack 20. The surface of the sheets 200 means the surface accessible by the gaseous precursors. For this, the parameters of the deposition, such as the exposure time 110 of the substrate to the precursors, the pressure of the reactive atmosphere containing the precursors, the deposition temperature, and in particular the temperature at which the substrate 2 is heated, can be adjusted. Furthermore, the absence of any intercalation compound 4, described below, or of an element of the reactor 5 configured to maintain the spacing 201 makes it possible to increase the accessible surface for the functionalisation by the layer 3.

Thanks to this spacing, the deposition 11 makes it possible to avoid a deployment or an unwinding of the substrate 2 which would be intended to expose one or both faces of its sheets to the precursors. It is subsequently not necessary that the deposition reactor 5 comprises numerous movable parts intended for the deployment or for the unwinding of the substrate 2. More specifically, the deposition chamber 50 can have no movable part configured to deploy or unwind the substrate 2. Furthermore, with respect to a deployed substrate, for example only comprising one sheet not superposed with itself or with other sheets, the substrate 2 is made more compact. The surface of the substrate 2 in contact with the gaseous precursors at each instant of the deposition 11 is therefore maximised with respect to the current solutions. Thus, the method makes it possible to functionalise a large substrate surface by a thin layer in a reduced time with respect to the current solutions. An extended surface substrate 2 can further be functionalised by limiting the volume of the deposition chamber 50. The equipment associated with the method is therefore simplified. The robustness and the service life of the associated equipment are consequently improved. It is therefore understood that the method 1 makes it possible to functionalise an extended surface substrate 2 in a simplified manner, thus enabling applications on the industrial scale.

Thanks to the diffusion of gaseous precursors in the stack, the deposition enables an infiltration of precursors on the surface of the sheets 200 of the stack 20. The chemical deposition 11 from the gaseous precursor, thus makes it possible to functionalise a polymer-based substrate 2 having a complex geometry, for example a porous substrate and/or having a high surface roughness. With the deposition 11 being done from gaseous precursors, the method further avoids an immersion of the substrate 2 in a liquid phase which could damage certain substrates, and in particular the bio-sourced polymer-based substrates like cellulose and polylactic acid.

The method can further comprise, prior to the provision of the substrate 20, a shaping of at least one material to obtain a substrate 2 comprising the stack 20. For this, at least one polymer-based material, and preferably cellulose, can be provided 12. The material can then be shaped 13, for example folded, wound, cut, and/or assembled to obtain the stack 20. The shaping 13 of the material can further comprise the arrangement of an intercalation compound 4, described in more detail below. The intercalation compound 4 is, in particular, configured to induce and finely control the spacing 201 between the sheets 200 of the stack 20. According to an alternative example, during the deposition 11 of the layer 3, the substrate 2 is, for example, an intercalation compound.

The method 1 can further comprise, after the deposition 11, an at least partial, even total, calcination 14 of the substrate 2. More specifically, the substrate 2 can be heated to a temperature, on the one hand, greater than the degradation temperature of the substrate 2, and on the other hand, less than the degradation temperature of the thin layer 3. The substrate 2 can be heated until substantially all of the substrate 2 is calcined. The substrate 2 thus plays the role of a template for the deposition of the thin layer 3. Thus, the material forming the substrate 2 can be calcined while preserving the structured thin layer 3 according to the spatial configuration of the substrate 2. Thus, a structure composed of at least 90%, even at least 99% of the thin layer 3 is obtained. According to an example, the substrate 2 is cellulose-based and the substrate 2 can be heated to a temperature greater than 200° C., even between 200° C. and 1500° C. When the substrate 2 is cellulose-based, the substrate 2 can be heated to a temperature between 500° C. and 1500° C., even between 600° C. and 1500° C. From 600° C., a total calcination of the cellulose is favoured, even ensured.

The method 1 can further comprise, after the deposition 11, a shaping 15 of the functionalised substrate 2, in particular in view of its transport or of a particular application. During this shaping 15, the functionalised substrate 2 can be, for example, unfolded, unwound, folded, cut, disassembled or assembled or a combination of these actions. In particular, the intercalation compound 4 can, if necessary, be removed from the functionalised substrate 2. It is noted that the shaping of the substrate 15 can be performed before or after the calcination 14 of the substrate 2. For example, the intercalation compound 4 can be removed before the calcination 14, which is particularly interesting in the case where the degradation temperature of the intercalation compound is greater than that of the thin layer 3.

Figure 2A:
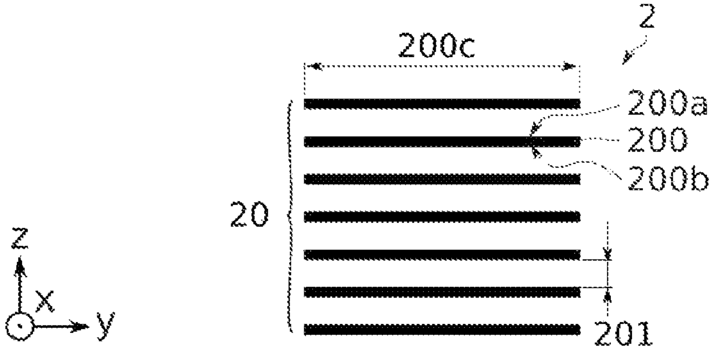
FIGS. 2A to 2E schematically represent the substrate comprising a stack of a plurality of sheets according to different embodiments.
Figure 2B:
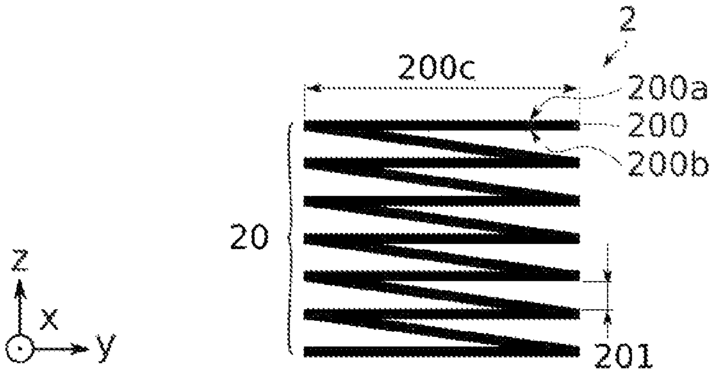

The stack 20 is now detailed in reference to FIGS. 2A to 2E. As stated above, the substrate 2 comprises a plurality of sheets 200 at least partially superposed two-by-two to form the stack 20. The stack comprises at least two sheets 200, even at least five sheets 200, even at least ten sheets 200. As illustrated in FIGS. 2A and 2B, each of the sheets 200 can extend substantially in a main extension plane (x, y) and be at least partially juxtaposed to another sheet of the sheet in a direction z substantially perpendicular to the plane (x, y). Each sheet 200 has a first face 200*a* and a second face 200*b* opposite the first face. In the stack 20, a part 200*c* of the face 200*a* of a sheet 200 can be superposed to a part 200*c* of the face 200*b* of another sheet 200. These parts 200*c* can together have at least locally the spacing 201. Preferably, at least two adjacent sheets 200 in the direction z, even the sheets of each pair of adjacent sheets 200 in the direction z of the stack 20, are superposed to one another at least over 50%, even at least over 70%, even at least over 90%, even at least over 95% of the surfaces of their faces 200*a*, 200*b* facing one another.

The spacing 201 can be considered as an average of all of the parts 200*c* of the faces 200*a*, 200*b* of the sheets 200 facing one another, in the stack 20. The spacing 201 is thus, on average, non-zero. This does not therefore exclude local contact points between the sheets 200*a*. By the presence of the spacing 201 between the sheet(s) 200, along a cutting plane including the direction z according to the examples illustrated in FIGS. 2A and 2B, or along a cutting plane perpendicular to the axis z, according to the examples illustrated in FIGS. 2C and 2D, the substrate 2 can be seen as discontinuous. Along a cutting plane including the direction z, according to the examples illustrated in FIGS. 2A and 2B, or along a cutting plane perpendicular to the axis z according to the examples illustrated, in FIGS. 2C and 2D, the substrate can have a first density in the thickness $e_{200}$ of the sheets 200. This density can be substantially homogenous in the sheets 200. Along said cutting planes, the substrate 2 can have a second density at the interface between the sheets 200, the second density being less than the first density, even substantially zero. The interface between the sheets preferably has a length along the direction z equal to the spacing 201.

The thin layer 3 having a thickness $e_3$, at least one spacing 201, and preferably each spacing 201, can be greater than $2e_3+L_d$, with $L_d$ a distance greater than 50 nm. The thickness $e_3$ can be an apparent thickness. Each spacing 201 can be less than 5 mm, even less than 1 mm, even less than 0.5 mm, preferably less than 200 μm, even less than 20 μm. The spacing can be substantially equal to the roughness of the surface of the sheets 200.

Different examples of configurations of the stack 20 are now described in reference to FIGS. 2A to 2E.

As illustrated in FIG. 2A, the sheets 200 of the stack 20 can be distinct from one another. According to an example, the sheets of the stack form a non-monolithic substrate 2, such as a ream of paper.

Figure 2C:
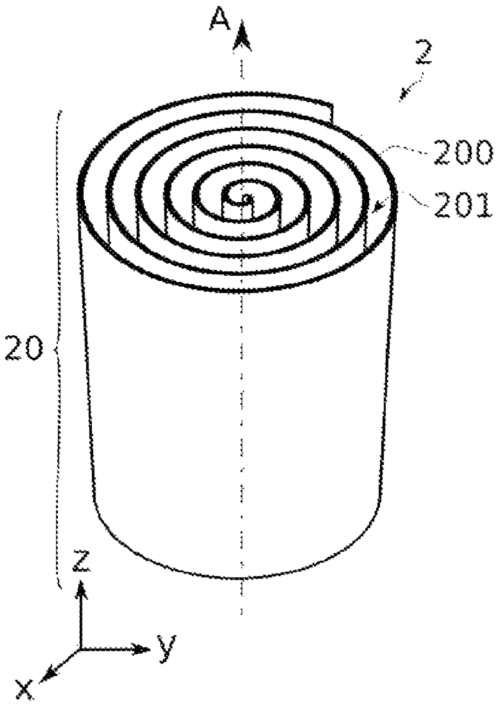
Figure 2D:
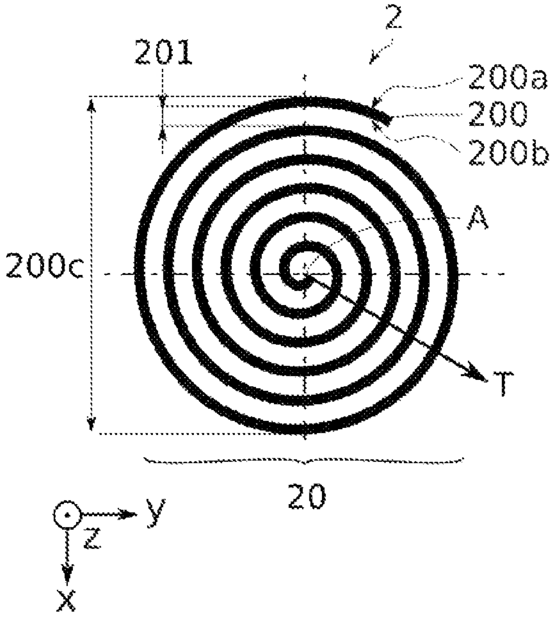

As illustrated in FIGS. 2B to 2D, the sheets 200 of the stack 20 can be integral with one another, for example they form a monolithic substrate 2. Equivalently, it can be considered that the substrate 2 is formed of one single sheet 200. The sheets can be assembled to one another, for example by weaving or by bonding. The substrate 2 can further have no discontinuity between the sheets 200.

According to a more particular example, illustrated in FIG. 2B, the stack 20 can be a superposition of parts 200*c* of a sheet 200, obtained by folding a monolithic sheet. The part 200*c* of the sheet 200 can thus be delimited between an edge of the substrate 2 and a fold of the substrate 2 substantially parallel to this edge, or between two consecutive folds of the substrate 2. The parts 200*c* of the sheet 200 of the substrate 2 can each extend in a plane, the planes of the different parts 200*c* of the sheet 200 being substantially parallel to one another.

According to another example, the stack 20 can be a coil, as illustrated by FIGS. 2C and 2D. According to this example, the substrate 2 can be wound on itself to form a sheet 200 wound on itself. This coil can have an axis of revolution A in the direction z. The parts 200*c* of the sheet 200 can be superposed in a stack direction T perpendicular to the axis A, as illustrated in FIG. 2D. The parts 200*c* of the sheet 200 thus extend in a succession of curved planes forming a spiral centred on the axis A, as illustrated by FIG. 2D. Alternatively, sheets 200 could be wound so as to each form a cylinder and the cylinders thus formed would be placed concentrically to form the stack 20.

Figure 2E:
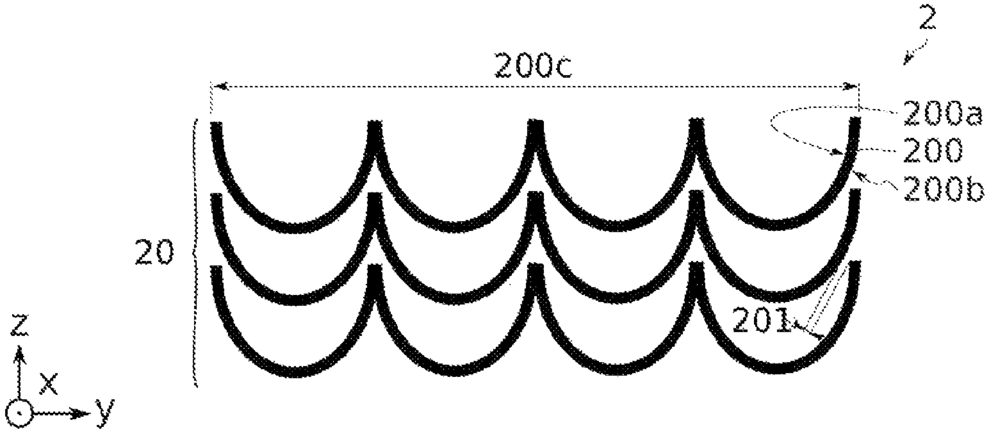
Figure 3A:
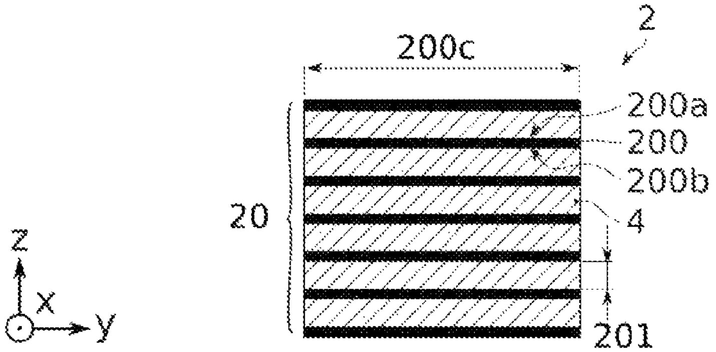
FIGS. 3A to 3E schematically represent the substrate illustrated in FIGS. 2A to 2E, with an intercalation compound between the sheets of the stack.
Figure 3B:
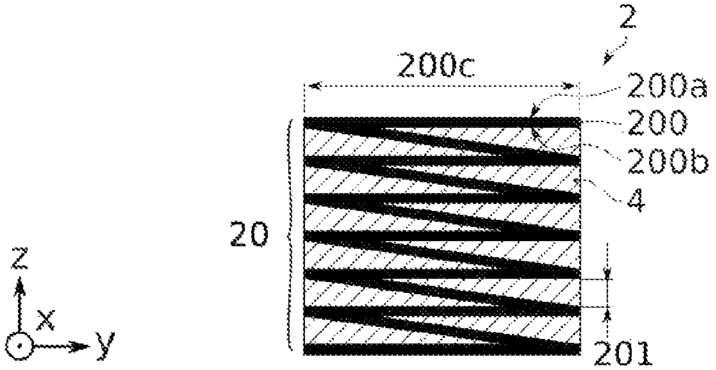
Figure 3C:
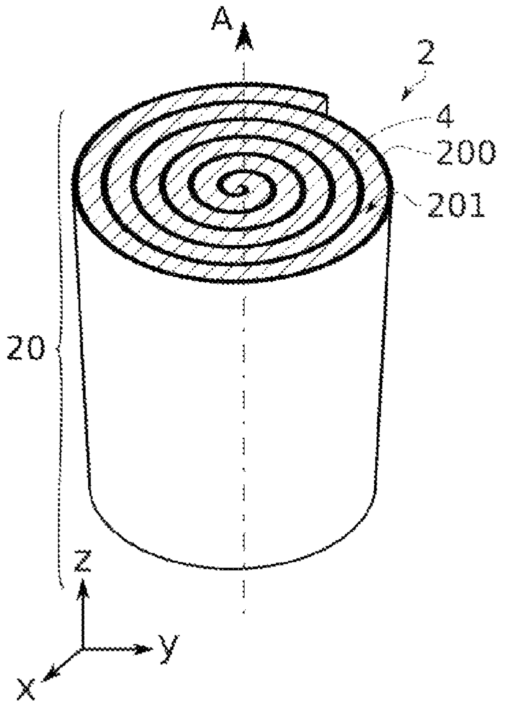
Figure 3D:
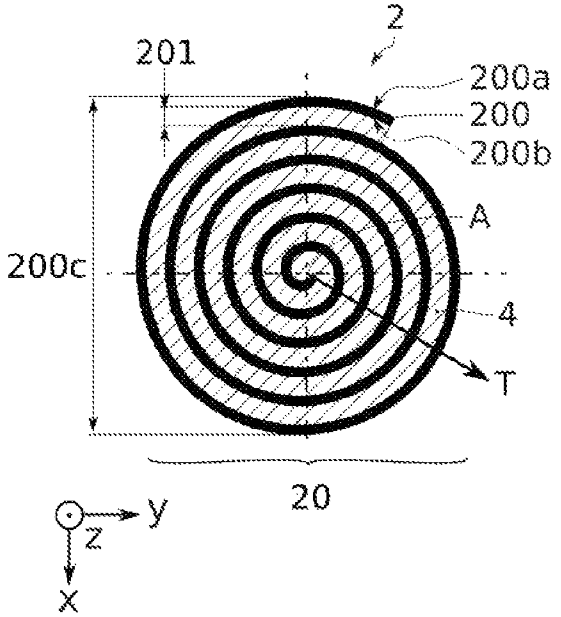
Figure 3E:
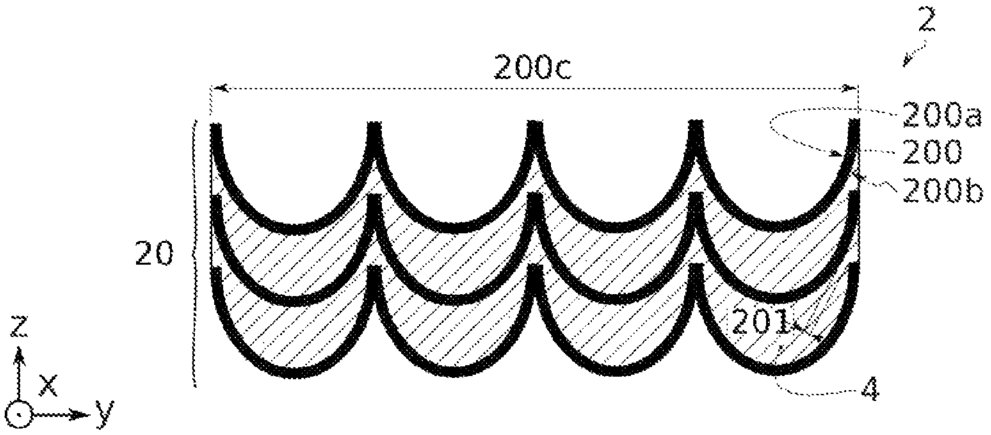
Figure 4A:
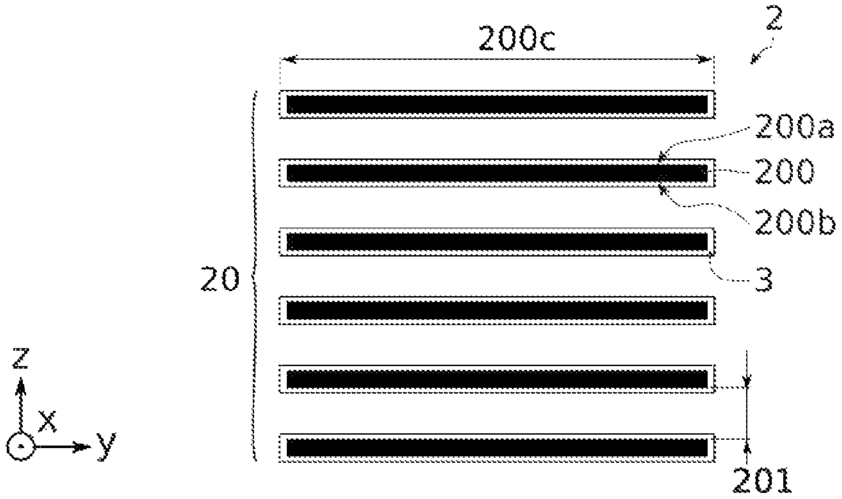
FIGS. 4A to 4D schematically represent the substrate illustrated in FIGS. 2A, 2B, 2D and 2E, after deposition of a thin layer according to an embodiment of the functionalisation method according to the first aspect of the invention.
Figure 4B:
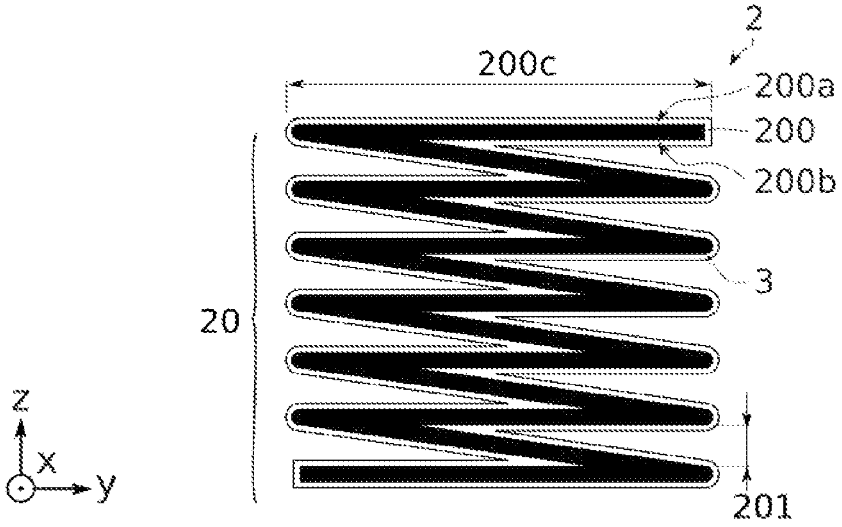
Figure 4C:
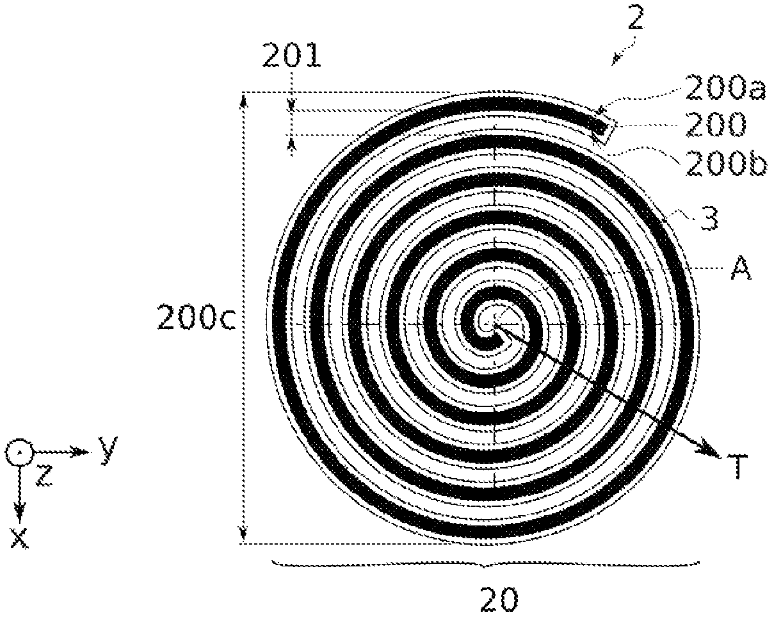
Figure 4D:
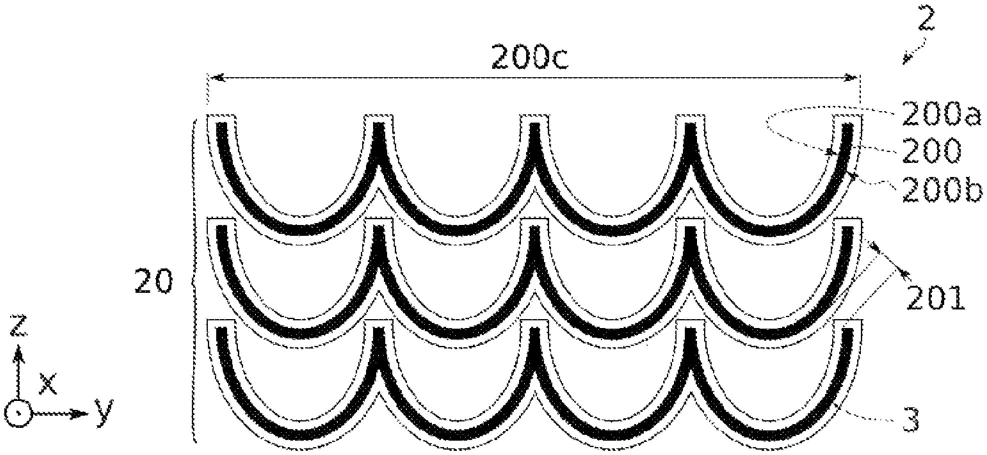

The sheet(s) 200 can further have a three-dimensional geometry, and in particular a complex geometry. By complex geometry, this means that the sheet(s) 200 is/are non-flat. The sheet(s) 200 extend(s), for example, in a main extension plane (x, y) and in the direction z. As for example illustrated by FIG. 2D, several sheets 200 with a complex geometry can be stacked. An "eggbox" shape is illustrated in FIG. 2E in a non-limiting manner. Any other shape which is compatible with a stack of sheets 200 can be provided, for example a corrugated, crenelated shape. As a non-limiting example, the substrate can be in the form of a capsule, for example a coffee capsule, bottle, can, packaging tray, plate, straw, glass or also cup.

The substrate 2 is formed from, even is constituted of, a polymer-based material and more specifically cellulose-based or made of cellulose. The substrate 2 can therefore have properties of the material constituting it. When the substrate is cellulose-based, the material has the advantage of being at least partially and preferably totally biodegradable, renewable and recyclable. This material can have, on at least one of its faces, a surface roughness substantially between 5 nm and 20 μm, even between 0.1 μm and 200 μm, preferably between 0.1 and 100 μm, preferably between 0.1 μm and 20 μm, even between 100 nm and 1000 nm. Preferably, the roughness is substantially greater than or equal to 0.1 μm. The spacing 201 can thus be induced locally by the surface roughness of the sheets 200, the sheets 200 locally having contact points. During the development of the invention, it has been highlighted that a roughness substantially greater than or equal to 0.1 μm makes it possible to conserve a spacing sufficient for enabling the diffusion of gaseous precursors. Preferably, the roughness is substantially less than or equal to 200 μm, preferably 100 μm.

A measurement of roughness of the surface of the cellulosic material can be taken by optical profilometry. The observation of the topography of the surface can be made over ranges going from a few $\mu m^2$ to a few $mm^2$. Confocal and/or interferometry microscopy techniques can be used according to the expected roughness of the cellulosic material. These two techniques make it possible to reach respectively nanometric and sub-nanometric resolutions. In both cases, the extracted topography makes it possible to increase to the average amplitude parameters conventionally used as the difference of the arithmetic average (Ra) and the difference of the root mean square (Rq, also called RMS):

$$Ra = \frac{1}{L}\sum_{x=0}^{L}(|Z_x - \bar{Z}|)$$

$$Rq = \sqrt{\frac{1}{L}\sum_{x=0}^{L}(Z_x - \bar{Z})^2}$$

With $$\bar{Z} = \sum_{x=0}^{L} Z_x$$

et L, the length scanned every x points. Thus, any other technique having a resolution and a similar observation zone can be used to access Ra and Rq.

Alternatively or in combination, the substrate 2 can have an open porosity. The gaseous precursors thus diffuse in the spacing 201 between the sheets 200 and through the sheets 200 in the direction z according to the examples illustrated in FIGS. 2A and 2B or in any plane perpendicular to the axis z according to the examples illustrated in FIGS. 2C and 2D. When the substrate 2 has an open porosity, the faces 200*a*, 200*b* of each sheet 200 can be at least partially formed by the cavities that it has. It is therefore understood that a porous substrate can have a surface roughness in the ranges stated above, for example greater than 0.1 μm. The method 1 makes it possible to deposit a thin layer 3 in the cavities of the sheets 200. By infiltration of the precursors, the deposited thin layer 3 can be of a substantially constant thickness in the volume of the sheets 200. The diffusion of the precursors in the stack 20 is facilitated. When the substrate is porous, the surface of the substrate 2 in contact with the gaseous precursors at each instant of the deposition 11 is further maximised. Thus, the method makes it possible to functionalise a large substrate surface by a thin layer in a further reduced time.

A measurement of porosity (ø) can be taken from the measurement of the density of the porous substrate 2 ($\rho_{porous}$) and of the knowledge of the theoretical density of cellulose ($\rho_{cellulose}$). In the case where the fluid contained in the pores is air, the following equation can be used:

$$\phi = 1 - \frac{\rho_{porous}}{\rho_{cellulose}}$$

$\rho_{porous}$ et $\rho_{cellulose}$ are of the same unit (typically in $kg/m^3$). Thus, ø will be ideally equal to zero for a cellulose bulk material and equal to 1 for a material containing exclusively air. The value of $\rho_{porous}$ can be calculated from the measurement of the mass ($m_{porous}$) and of the volume ($V_{porous}$) of the porous sample according to the equation:

$$\rho_{porous} = \frac{m_{porous}}{V_{porous}}$$

The measurement can, for example, be taken on a porous sample being either a sheet of a set of unstacked sheets ($ø_{sheet}$), or a sheet stack ($ø_{stack}$).

The spacing 201 between the sheets 200 can be modulated during the shaping 13 of the material from which the substrate is formed. The stack 20 can be more or less compact. For example, a coil can be wound in a more or less narrow way. The spacing 201 can further be ensured by an intercalation compound 4. As illustrated by FIGS. 3A to 3E, the intercalation compound 4 can be disposed on the material such that it is located between the sheets 200 of the stack 20, preferably between each pair of sheets superposed to one another in the stack.

This arrangement 130 can be achieved, for example, during the shaping 13 of the material from which the substrate 2 is formed. For this, the intercalation compound 4 can be superposed on at least one face of the material, over at least 50%, even 70%, even at least 90%, even at least 100% of the surface of this face of the material. The assembly formed by the material and the intercalation compound 4 can then be shaped 13, for example folded, wound, cut, and/or assembled to obtain the stack 20 of the substrate 2.

The intercalation compound 4 can be porous. Thus, the gaseous precursors can diffuse through the intercalation compound 4. Alternatively, or complementarily, the intercalation compound 4 can have a surface roughness of between 5 nm and 1000 nm and thus enable the diffusion of the gaseous precursors at the interface between the intercalation compound 4 and the sheets 200 in the stack 20. The intercalation compound can be monolithic or discontinuous.

According to an example, the intercalation compound 4 is an open paper. Preferably, the open paper has an increased porosity and/or roughness in the ranges indicated, in order to facilitate the diffusion of the gaseous precursors. According to another example, the intercalation compound 14 is a grid.

Alternatively, the substrate 2 can have no intercalation compound or equivalently, any additional element to the substrate 2 making it possible to maintain the spacing 201. The spacing 201 can preferably be defined only by the shape of the substrate 2 and/or of its surface roughness. For example, a sheet 200 in the form of a folding or of a coil, as illustrated, for example, in FIGS. 2B and 2D induces a spacing by the folds or the spires of the sheet. For example, a sheet 200 having a three-dimensional shape with a complex geometry, as illustrated, for example, in FIGS. 2B and 2D induces a spacing by the folds or the spires of the sheet. The method is therefore simplified, in particular by avoiding an additional manipulation of the substrate to implement the intercalation compound. Furthermore, the risk that a zone of the substrate 2 is not functionalised, as covered by the intercalation compound, is avoided.

The material from which the substrate 2 is formed can be a material having a roughness enabling its shaping. More specifically, the Young's modulus of the material can be between 0.01 MPa and 100 MPa.

At least some of the sheets 200, even each sheet 200 of the stack 20 can have a thickness $e_{200}$ less than 5 mm, preferably less than 1 mm, preferably less than 0.5 mm. Alternatively, or complementarily, each sheet is preferably a paper or a tissue.

Alternatively to the preceding paragraph, at least some of the sheets 200, even each sheet 200 of the stack 20, can have a thickness $e_{200}$ greater than 5 mm. Alternatively, or complementarily, each sheet is preferably a foam, or a dehydrated gel such as a xerogel, a cryogel and an aerogel.

According to a preferred embodiment of the invention, the material from which the substrate 20 is formed is based on, even is constituted of, a bio-sourced polymer and more specifically, cellulose. Thus, the functionalised substrate obtained is mainly bio-sourced. According to an example, the substrate 2 is starch-based, for example polylactic acid (PLA)-based, or based on its derivatives.

According to another example, the substrate is cellulose-based. The substrate can be based on or made of a lignocellulosic material, comprising cellulose and lignin. The molar mass of the monomer unit of cellulose can be substantially equal to 162 g/mol. The density of cellulose can be substantially equal to 1.54 $g \cdot cm^{-3}$. The Young's modulus of cellulose can be between 3 and 4 GPa.

The material can be open or closed. The substrate 20 can be formed from a plurality of materials. According to an example, this plurality comprises at least one open material and at least one closed material. The substrate 20 can, for example, comprise a stack 20 of sheets 200, the sheets 200 being, alternately in the stack 20, based on an open material and based on a closed material. For example, the substrate 20 can be obtained by winding or by folding a superposition of an open material and of a closed material. According to this example, the open material can form an intercalation compound 4.

The material can, in particular, be cellulose fibre-based and/or cellulose nanofibre-based. According to an example, the material is a tissue. It is noted that the tissue can be open or closed. Thus, the substrate comprising a stack of the material, it is possible to functionalise the tissue in a simplified manner and in parallel. According to an example, the material is a wood. According to another example, the material is a closed paper, such as a sulphurous paper, a tracing paper or a silicone paper.

According to an alternative example, the substrate can be an open paper, a foam, a dehydrated gel such as an aerogel, a xerogel and a cryogel. An open paper is, for example, a blotting paper. A cellulose-based material, of the paper type can be obtained by conventional techniques of the paper-making industry as well as by the techniques for obtaining dehydrated gel, i.e. a gel of which the free water fraction has been removed, for example by sol-gel synthesis, then by evaporation of the free water fraction, for example by lyophilisation. According to an example, the material is a particular paper, for example, a cardboard. According to an example, the material be based on or made of moulded cellulose. Moulded cellulose is a material mainly made from papers, in particular recycled papers, and water. Moulded cellulose is, for example, used in packaging applications. A moulded cellulose-based substrate 2 can, in particular, have a three-dimensional geometry, as illustrated in FIG. 2E. Moulded cellulose packaging is generally coated with a plastic coating, typically applied by hand or by soaking. The method makes it possible to functionalise a substrate based on or made of moulded cellulose, in a simplified manner and which is compatible with an application on the industrial scale.

As an example, a dehydrated gel can be obtained by dehydration of a gel. A dehydrated gel can comprise a water proportion less than 10%, even less than 5%, even less than 1%, with respect to the total mass of the dehydrated gel.

A xerogel can be obtained by free air drying. During drying, water evaporates and exerts a high capillary traction on the polymer chains, which has the effect of retracting them, typically at a rate greater than 90%. A low-porosity gel is formed, typically of a porosity less than 40%.

A gel can be dehydrated by replacement of water by a liquid phase, then moving to the gaseous state, for example by supercritical drying, to obtain an aerogel. Supercritical drying makes it possible to avoid phase changes of the solvent in the gel could deteriorate its microstructure. Supercritical drying makes it possible to preserve the porosity of the gel, as well as the spatial arrangement of the polymer chains, with a retraction rate typically less than 15%. An aerogel typically has a porosity greater than 98%.

A gel can further be treated by lyophilisation to obtain a cryogel. For this, the gel can, for example, be immersed in a liquid nitrogen bath for freezing to the shape of a mould. Then, by low-temperature sublimation, for example at less than 0° C., the cryogel is obtained. A cryogel typically has a porosity greater than 98%.

Below, by aerogel, this means all dehydrated gels, and therefore whether this is a xerogel, a cryogel or an aerogel.

The substrate 2 obtained after the chemical vapour deposition 11 of the thin layer 3 is illustrated as an example by FIGS. 4A to 4D. It is noted that in FIG. 4D, the spacing 201 appears greater than that of FIGS. 2E and 3E for a better legibility of the figure with the representation of the thin layer 3. The deposition temperature 11, and more specifically, the temperature at which the substrate 2 is heated, can be less than 200° C., even between the ambient temperature and 200° C., even between 20° C. and 200° C., and preferably between 60° C. and 150° C. Thus, the energy cost of the method is minimised. With the degradation temperature of cellulose being substantially 200° C., this temperature further makes it possible to minimise, even avoid, a degradation of the substrate 2 during the deposition.

The deposition 11 can, in particular, be configured such that the deposited thin layer 3 has a thickness less than 100 nm over at least 80%, even at least 90%, even at least 99%, of the at least one deposited thin layer 3. Preferably, the thickness of the thin layer 3 is between 1 angstrom, which typically corresponds to an atomic monolayer, and 100 nm, even between 10 nm and 60 nm, even between 10 and 40 nm. By limiting the thickness of the thin layer, the cost of the method and of the functionalised substrate is reduced. Between 10 and 60 nm, the risk of rupture of the thin layer 3 during the manipulation of the substrate 20 is limited. Furthermore, when the substrate 2 is bio-sourced polymer-based, and by the thickness ranges described, the functionalised substrate obtained can be bio-sourced at least 95% by mass with respect to its total mass. Moreover, these thin layer 3 thickness ranges limit, even avoid, an alteration of the appearance, and in particular of the colour of the substrate 2. For example, if the material from which the substrate 2 is formed is transparent, the material obtained from the method 1 is also transparent. According to an example, the thickness of the thin layer 3 is substantially constant over at least 50%, even at least 80%, even at least 90%, even at least 99%, of the at least one deposited thin layer 3.

During the chemical deposition of the thin layer 3, the pressure of the reactive atmosphere comprising the gaseous precursors can be between 0.1 mbar and 1000 mbar, even between 0.1 mbar and 100 mbar. The pressure of the reactive atmosphere can be substantially constant. Alternatively, during the chemical deposition of the thin layer 3, the pressure of the reactive atmosphere comprising the gaseous precursors can vary in a range between 0.1 and 1000 mbar, even between 0.1 and 100 m bar.

According to an example, during the deposition 11, the substrate 20 can be exposed simultaneously to the different gaseous precursors. According to an example, the deposited thin layer 3 can be polymer-based. The deposition can, for example, be a chemical vapour deposition commonly called Initiated Chemical Vapour Deposition (iCVD), that can be conveyed by in situ initiated polymerisation.

According to a preferable embodiment, during the deposition 11, the substrate 20 can be exposed sequentially to the different gaseous precursors. According to this example, the deposition 11 of the thin layer 3 is performed by atomic layer deposition (ALD). An ALD deposition has several advantages, with respect to a chemical vapour deposition (CVD). These advantages are detailed below.

ALD deposition is particularly suitable for functionalising a polymer-based substrate, in particular made of bio-sourced polymer, like cellulose, and/or having a complex geometry.

ALD deposition further makes it possible to deposit thin layers 3 having varied microstructures. The thin layer 3 deposited by ALD can be amorphous, monocrystalline or polycrystalline. The thin layer 3 can have a preferable crystalline orientation.

By an ALD deposition, the thin layer 3 is conform, i.e. that the thin layer 3 has one same thickness, to close manufacturing tolerances, despite the changes in layer direction. Thanks to ALD deposition, the thickness of the thin layer 3 can be finely controlled. With the deposition being conform and of a controlled thickness, it is understood that ALD deposition facilitates the deposition 11 of a thin layer 3 by minimising the risk of filling the spacings 201 between the sheets 200 of the stack 20.

During the development of the invention, it has been highlighted that the ALD deposition 11 of a thin layer 3 of thickness less than 100 nm on a bio-sourced polymer-based substrate 2, and in particular cellulose-based, is sufficient for improving the mechanical properties and/or the gas barrier properties, in particular dioxygen and carbon dioxide, and water barrier properties of the substrate 2.

ALD deposition 11 comprises a sequence of depositing a plurality of cycles comprising an exposure 110 of the substrate 2 to the gaseous precursors, as the dotted arrow in step 110 of FIG. 1 illustrates. In a cycle, the exposure 110 can be following by a draining by an inert gas, for example dinitrogen. The number of cycles in the sequences makes it possible to modulate the deposited thickness. During a cycle, the substrate can be exposed 110 to the gaseous precursors over a duration of between 1 second and 1 hour, even between 1 second and 10 minutes, preferably between 1 second and 30 seconds. The draining can last from between 1 second and 1 hour, even between 1 second and 30 seconds.

Figure 5:
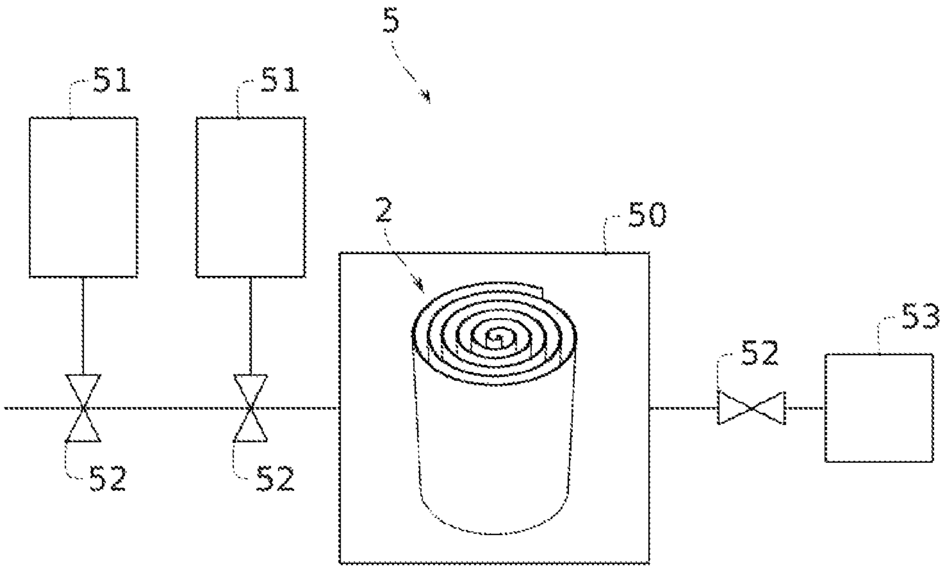
FIG. 5 schematically represents an atomic layer deposition reactor implemented by the functionalisation method according to the first aspect of the invention.

As an example, an ALD deposition reactor 5 is now described in reference to FIG. 5. The reactor 5 can be adjusted by temperature or not. The substrate 2 is provided in a deposition chamber 50. Reservoirs 52 contain the precursors, each reservoir being connected to the deposition chamber 50 and being able to have a flow rate adjustment system. It is noted that in the reservoirs 51, the precursors can be in the solid, liquid or gaseous state. The precursors are moved to the gaseous state to be driven into the deposition chamber 50, for example via a bubbling system in the reservoirs 51. The reactor further comprises a pumping system 53, for example connected to the deposition chamber 50. The reactor further comprises valves 52 enabling the functioning of the reactor according to the desired mode.

According to an example, the reactor 5 is configured relative to the substrate 20, such that the gaseous precursors are injected parallel to at least one main extension direction of the spacing 201. For example, for the substrates illustrated in FIGS. 2A, 2B, 3A and 3B, the gaseous precursors can be injected in the direction x. For the substrate illustrated in FIGS. 2C and 3C, the gaseous precursors can be injected in the direction z.

The deposited thin layer 3 can be based on, even constituted, of a material, the deposition temperature of which is compatible with the stability temperature of the substrate 2. More specifically, this material can be chosen from among an oxide, a nitride and an oxynitride. These materials can, for example, be of chemical formula:

$Al_2O_3$,$TiO_2$,$SiO_2$,AgO;ZnO oxide:

AlN,TiN,TaN,NbN, nitride:

AlON,NbON,TaON. oxynitride:

The precursors associated with the material of the thin layer 3 are known to a skilled person. For example, the precursors for depositing a thin layer 3 of $Al_2O_3$ can be trimethylaluminium and water. The precursors for depositing a thin layer 3 of $TiO_2$ can be titanium tetraisopropoxide and water.

During the development of the invention, it has been highlighted that a deposition of a thin oxide, nitride or oxynitride layer 3 in the thickness ranges described above, on a polymer-based substrate, in particular bio-sourced, makes it possible to significantly improve its water and oxygen barrier properties, and flame retardant properties. Furthermore, the mechanical properties of the substrate 2 are not degraded by this deposition. The substrate 2 obtained has, in particular, a rigidity similar to the non-functionalised substrate 2 in a dry environment. Furthermore, the mechanical properties of the functionalised substrate 2, in a wet environment, can be improved with respect to the non-functionalised substrate 2.

It has been further observed that after calcination of the substrate 20, a structure formed at least 90%, even 99%, by a thin oxide, nitride or oxynitride layer 3, has a resistance to high temperatures, typically up to 1800° C. The structure further has a thermal flow barrier property, advantageous for thermal insulation.

A closed paper, such as a cellulose nanofibre film, functionalised by the method 1 is particularly suitable for applications such as packaging, for storage of food, or as a substrate for an organic light-emitting diode (OLED).

A functionalised aerogel can have a porosity greater than 98%, even 99% and a density less than 50 $kg \cdot m^{-3}$, for example between 10 $kg \cdot m^{-3}$ and 50 $kg \cdot m^{-3}$. The functionalised aerogel preserves its structural integrity during brief passages to very high temperatures, for example greater than 1600° C. and has a low thermal conductivity, for example less than 0.026 $W \cdot m^{-1} \cdot K^{-1}$ at substantially 20° C. and at substantially 1 atmosphere (equal to 1013 hPa in the International System of Units). A functionalised aerogel is particularly suitable for thermal insulation.

An open paper is particularly suitable for forming a membrane.

Examples of materials obtained from the method, as well as their properties are now described. It is noted that the material obtained from the method can have any feature resulting from the implementation of the method.

Figure 6A:
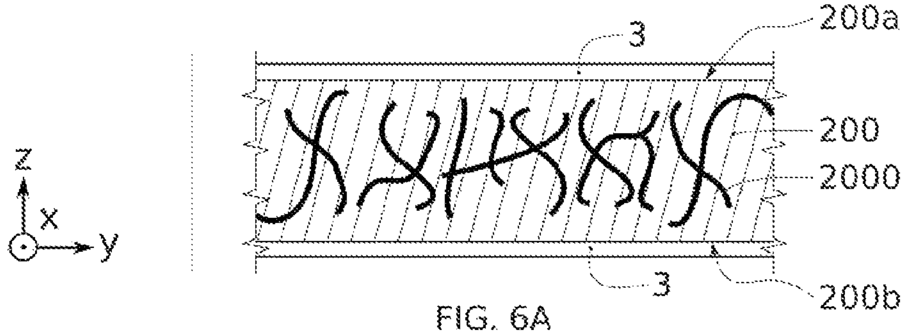
FIGS. 6A and 6B schematically represent a cross-sectional view of the functionalised substrate according to two embodiments of the functionalisation method according to the first aspect of the invention.

A functionalised closed paper is illustrated by FIG. 6A, comprising cellulose fibres or nanofibres 2000. The thin layer 3 is deposited on the faces 200*a* and 200*b* of the sheet 200. The side edges perpendicular to the faces 200*a*, 200*b* can be functionalised by the thin layer 3, or have none, for example following a cutting 15 of the sheet 200 after the deposition 11. The permeation with dioxygen (in $cm^3 \cdot m^{-2} \cdot day^{-1}$) of a non-functionalised, and functionalised closed cellulose nanofibre (CNF) paper, and functionalised by a deposition of 40 nm of $Al_2O_3$, are summarised in the table below according to the relative humidity (% RH) of the environment, compared with a 50 μm polyethylene-terephthalate (PET) film.

| | 0% RH | 50% RH | 80% RH |
|---|---|---|---|
| CNF paper | 30 ± 10 | 100 ± 20 | >500 |
| CNF paper + 40 nm $Al_2O_3$ by ALD | <1 | 5 ± 2 | 150 ± 20 |
| PET | <1 | <1 | <1 |

Figure 6B:
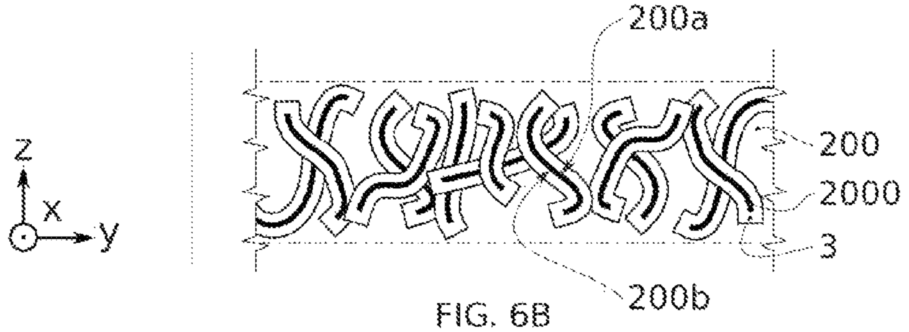

An open paper and a functionalised aerogel can be illustrated by FIG. 6B. According to this example, the thin layer 3 is deposited on the cellulose fibres or nanofibres 2000, and the schematic contour of the sheet is represented as a dotted line.

During the development of the invention, it has been shown that a cellulose fibre paper covered by ALD of a 40 nm $Al_2O_3$ layer, for example of grammage 5 $g \cdot m^{-3}$, has a Young's modulus 15% greater than the Young's modulus of the non-functionalised paper. This paper further has an internal cohesion 60% greater than the internal cohesion of the non-functionalised paper. This paper can be hydrophobic, with a contact angle with water of 120°. This paper can further have flame retardant properties and be water-resistant. It can, in particular, be non-degraded after at least 15 minutes of immersion being stirred in water.

Moreover, it has been shown that a cellulose nanofibre aerogel covered by ALD of a 40 nm $Al_2O_3$ layer, has a Young's modulus 25% greater than the Young's modulus of the non-functionalised aerogel. The Young's modulus E and the density d of the material obtained from the method can be similar to those of expanded PET, that is substantially E=2 MPa and d=13 $kg \cdot m^{-3}$. The thermal conductivity of the functionalised aerogel can be substantially 30 $mW \cdot m^{-1} \cdot K^{-1}$ at atmospheric pressure.

This aerogel, after calcination 14, can have very good thermal insulation properties. The functionalised aerogel placed on a face in contact with a 1600° C. hot source, can make it possible to obtain a temperature of 30° C. on its face opposite the face in contact with the hot source, the two faces being spaced apart by 2 cm.

In view of the description above, it clearly appears that the present invention proposes an improve chemical vapour deposition method which is compatible with a functionalisation of a substrate which is compatible with an application on the industrial scale. In particular, the method enables a functionalisation of a bio-sourced substrate, by chemical deposition of a thin layer, which is compatible with an application on the industrial scale.

The invention is not limited the embodiments described above, and extends to all the embodiments covered by the claims.

LIST OF NUMERICAL REFERENCES

1 Method
10 Provision of the substrate
11 Chemical deposition of at least one thin layer
110 Exposure of the substrate to the gaseous precursors
12 Provision of a polymer-based material
13 Shaping of the material
130 Arrangement of an intercalation compound between sheets of the material
14 Calcination of the functionalised substrate
15 Shaping of the functionalised substrate
2 Substrate
20 Stack
200 Sheet(s)
200*a* First face
200*b* Second face
200*c* Part of a face
2000 Cellulose fibres/nanofibres
201 Spacing
3 Thin layer
4 Intercalation compound
5 Atomic layer deposition reactor
50 Deposition chamber
51 Precursor reservoir
52 Valves
53 Pumping system

The invention claimed is:

1. A method for functionalizing a cellulose-based substrate by chemical deposition of at least one layer, from gaseous precursors, comprising:

a provision of a cellulose-based substrate:

comprising a plurality of sheets, the plurality of sheets including first and second sheets which are distinct and at least partially superposed, the first sheet having a first face and a second sheet having a second face opposite the first face, at least one face having a surface roughness greater than or equal to 0.1 μm, the substrate being a closed substrate having a porosity not enabling the gaseous precursors to pass through the substrate, and the first face having a part superposed to another part belonging to the first face of the first sheet or to the second face of the second sheet, said parts being superposed, so as to conserve at least locally, a spacing between said parts, configured to enable a diffusion of the gaseous precursors, then a gaseous chemical deposition of at least one layer on the substrate such as provided, by injection of gaseous precursors in said spacing, along a direction parallel to at least one main extension direction of each sheet, the gaseous precursors diffusing at least in each spacing, wherein, during the chemical deposition of the at least one layer, the substrate has no intercalation compound in the spacing.

2. The method according to claim 1, wherein each spacing is only defined by a shape of the plurality of sheets, and/or the surface roughness of the substrate.

3. The method according to claim 1, wherein the at least one layer having a thickness $e_3$, each spacing is greater than $2e_3+L_d$, with $L_d$ a distance greater than 50 nm.

4. The method according to claim 1, wherein each spacing is less than 5 mm.

5. The method according to claim 1, wherein a temperature of the deposition of the at least one layer is less than 200° C.

6. The method according to claim 1, wherein the at least one deposited layer has a thickness $e_3$ less than 100 nm, over at least 80% of the at least one deposited layer.

7. The method according to claim 1, wherein the deposition of the at least one layer comprises at least one injection of the gaseous precursors so as to expose the substrate to the gaseous precursors for a duration of between 1 second and 1 hour.

8. The method according to claim 1, wherein the deposition of the at least one layer is performed by atomic layer deposition.

9. The method according to claim 1, wherein said parts belong to distinct sheets, for example, stacked or superposed, such that the parts in pairs face one another.

10. The method according to claim 1, wherein the substrate has a surface roughness of between 0.1 μm and 200 μm.

11. The method according to claim 1, wherein each sheet of the cellulose-based substrate has a thickness $e_{200}$ less than 5 mm.

12. The method according to claim 1, wherein the substrate is based on one from among cellulose fibres and cellulose nanofibres.

13. The method according to claim 1, the method further comprising, before the provision of the substrate, a shaping of a cellulose-based material, from which the substrate is constituted, so as to form the cellulose-based substrate.

14. The method according to claim 1, wherein the at least one deposited layer is a layer based on a material chosen from among an oxide, a nitride and an oxynitride.

15. The method according to claim 1, the method further comprising, after the chemical deposition of the at least one layer, a calcination of the substrate during which the substrate is heated to a temperature of between the degradation temperature of the substrate and the degradation temperature of the at least one layer.

16. A method for functionalizing a cellulose-based substrate by chemical deposition of at least one layer, from gaseous precursors, comprising:

a provision of a cellulose-based substrate:

comprising a plurality of distinct three-dimensional objects at least partially superposed, the plurality of distinct three-dimensional objects including first and second distinct three-dimensional objects, the first distinct three-dimensional object having a first face and the second distinct three-dimensional object having a second face opposite the first face, at least one face having a surface roughness greater than or equal to 0.1 μm, the substrate being a closed substrate having a porosity not enabling the gaseous precursors to pass through the substrate, and the first face having a part superposed to another part belonging to the first face of the first distinct three-dimensional object or to the second face of the second distinct three-dimensional object, said parts being superposed, so as to conserve at least locally, a spacing between said parts, configured to enable a diffusion of the gaseous precursors, then a gaseous chemical deposition of at least one layer on the substrate such as provided, by diffusion of gaseous precursors, the gaseous precursors diffusing at least in each spacing, wherein each three-dimensional object of the plurality of distinct three-dimensional objects, is in the form of a capsule, a bottle, a can, a packaging tray, a plate, a straw, a glass or a cup, without an additional intercalation compound in the spacing separating the plurality of distinct three-dimensional objects.

17. The method according to claim 16, wherein the cellulose-based substrate comprises moulded cellulose.

* * * * *